(12) United States Patent
Smeets et al.

(10) Patent No.: US 10,551,746 B2
(45) Date of Patent: Feb. 4, 2020

(54) LITHOGRAPHIC APPARATUS AND METHOD

(71) Applicant: ASML NETHERLANDS B.V., Veldhoven (NL)

(72) Inventors: Benjamin Cunnegonda Henricus Smeets, Weert (NL); Mark Constant Johannes Baggen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/774,165

(22) PCT Filed: Nov. 1, 2016

(86) PCT No.: PCT/EP2016/076274
§ 371 (c)(1),
(2) Date: May 7, 2018

(87) PCT Pub. No.: WO2017/084870
PCT Pub. Date: May 26, 2017

(65) Prior Publication Data
US 2018/0321593 A1 Nov. 8, 2018

(30) Foreign Application Priority Data

Nov. 20, 2015 (EP) .................................... 15195517

(51) Int. Cl.
*G03F 7/20* (2006.01)
(52) U.S. Cl.
CPC ...... *G03F 7/70258* (2013.01); *G03F 7/70241* (2013.01); *G03F 7/70341* (2013.01); *G03F 7/70858* (2013.01)

(58) Field of Classification Search
CPC ............. G03F 7/70241; G03F 7/70258; G03F 7/70341; G03F 7/70858
See application file for complete search history.

(56) References Cited

U.S. PATENT DOCUMENTS

| 4,666,273 A | 5/1987 | Shimizu et al. |
| 5,105,075 A | 4/1992 | Ohta et al. |

(Continued)

FOREIGN PATENT DOCUMENTS

| EP | 1020897 A1 | 7/2000 |
| JP | 2001085292 A | 3/2001 |

(Continued)

OTHER PUBLICATIONS

International Search Report PCT/EP2016/076274 dated Feb. 3, 2017.

(Continued)

*Primary Examiner* — Michelle M Iacoletti
(74) *Attorney, Agent, or Firm* — Arent Fox LLP (57) ABSTRACT

A lithographic apparatus comprises a substrate table for holding a substrate and a projection system for projecting a radiation beam onto a target region of the substrate so as to form an image on the substrate. The projection system comprises a lens element arrangement having a first lens element. A first pressure sensor is arranged to measure at least one pressure value adjacent the first lens element. A controller determines a first change in a pressure difference over the first lens element and/or a further lens element based on a signal received from the pressure sensor, determines adjustments to a position of one of the substrate table and projection system based upon the determined first change, and causes actuators to make adjustments to the substrate table or the projection system.

16 Claims, 5 Drawing Sheets

(56) References Cited

U.S. PATENT DOCUMENTS

| | | |
|---|---|---|
| 6,614,503 B1 | 9/2003 | Uzawa |
| 2003/0002088 A1 | 1/2003 | O'Hara |
| 2003/0076602 A1 | 4/2003 | Nishikawa |
| 2004/0179175 A1 | 9/2004 | Okada |
| 2007/0177118 A1 | 8/2007 | Sogard |
| 2008/0013063 A1 | 1/2008 | Hembacher et al. |
| 2008/0186467 A1 | 8/2008 | Hembacher |
| 2008/0192222 A1* | 8/2008 | Okada .................... G02B 3/12 355/67 |
| 2010/0149513 A1 | 6/2010 | Watson |

FOREIGN PATENT DOCUMENTS

| | | |
|---|---|---|
| JP | 2004281697 A | 10/2004 |
| JP | 2007318137 A | 12/2007 |
| JP | 2008503088 A | 1/2008 |
| JP | 2008505485 A | 2/2008 |
| WO | 2006059720 A1 | 6/2006 |

OTHER PUBLICATIONS

Office Action issued in JP Application No. 2018-526497 dated Jul. 9, 2019, 5 pages total (with English Translation).

* cited by examiner

LITHOGRAPHIC APPARATUS AND METHOD

CROSS-REFERENCE TO RELATED APPLICATIONS

This application is the U.S. National Stage Application of International Patent Application No. PCT/EP2016/076274, filed on Nov. 1, 2016 which claims priority of EP application 15195517.6 which was filed on Nov. 20, 2015 and which is incorporated herein in its entirety by reference.

FIELD

The present invention relates to methods and systems for the correction of image errors in a lithographic apparatus.

BACKGROUND

A lithographic apparatus is a machine that applies a desired pattern onto a target region of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target region (e.g. comprising part of, one or several dies) on a substrate (e.g. a silicon wafer) that has a layer of radiation-sensitive material (resist). In general, a single substrate will contain a network of adjacent target regions that are successively exposed. Known lithographic apparatus include so-called steppers, in which each target region is irradiated by exposing an entire pattern onto the target region in one go, and so-called scanners, in which each target region is irradiated by scanning the pattern through the beam in a given direction (the "scanning"-direction) while synchronously scanning the substrate parallel or anti parallel to this direction.

It is desirable to provide, a lithographic apparatus that obviates or mitigates one or more of the problems of the prior art, whether identified herein or elsewhere.

SUMMARY

According to a first aspect of the invention, there is provided a lithographic apparatus. The lithographic apparatus comprises a substrate table for holding a substrate and a projection system for projecting a radiation beam onto a target region of the substrate so as to form an image on the substrate, the projection system comprising a lens element arrangement having a first lens element. The lithographic apparatus further comprises a first pressure sensor arranged to measure at least one pressure value adjacent the first lens element and a controller. The controller is operable to, during operation of the lithographic apparatus, determine a pressure difference over the first lens element based on a signal received from the pressure sensor. The determined pressure difference may indicate a change in the pressure difference over the first lens element which may result in image errors at the substrate. The controller determines one or more adjustments to a position of at least one of the substrate table and projection system based upon the determined pressure difference, and causes one or more actuators to make the one or more adjustments to the at least one of the substrate table and the projection system.

In this way, the results of pressure differences over the first lens element and/or changes in the pressure difference may be determined and mitigated, thereby improving the quality of the imaging at the substrate. Furthermore, such determination and mitigation may be performed without the need to add complex and costly components to the projection system such as pressure manipulation devices. Rather, the mitigation may be performed using existing components, namely actuators that are already provided by the substrate table and the projection system.

The controller may be further operable to determine a displacement of the first lens element and/or a further lens element of the projection system and to determine the one or more adjustments based upon the determined displacement.

The controller may be further operable to determine one or more image error characteristics based upon the determined pressure difference and to determine the one or more adjustments based upon the determined image error characteristics.

The apparatus may further comprise a second pressure sensor arranged to measure at least one pressure value adjacent a second lens element of the projection system. The controller may be operable to determine a change in a pressure difference over the second lens element based on a signal received from the second pressure sensor. The controller may cause one or more actuators to make the one or more adjustments to the at least one of the substrate table and the projection system.

The substrate table may be in communication with at least a part of the projection system via a medium through which pressure waves may propagate.

The lithographic apparatus may further comprise a second substrate table for holding and moving a second substrate. The second substrate table may be in communication with at least a part of the projection system via a medium through which pressure waves may propagate. Movement of the second substrate table may therefore cause pressure waves to propagate and cause changes to the pressure differences over the first and/or second lens elements.

The first lens element may be a final lens element of the projection system. The first lens may be attached to a housing of the projection system via a seal, the seal being at least partially permeable to a surrounding environment of the first lens element.

The seal may act as a low-pass filter for pressure waves within the surrounding environment of the first lens. In this case, the first change may be a change in the pressure difference over a lens element adjacent the first lens element.

According to a second aspect described herein, there is provided a method for controlling a lithographic apparatus during operation, the lithographic apparatus comprising a substrate table for holding a substrate and a projection system for projecting a radiation beam onto a target region of the substrate so as to form an image on the substrate, the projection system comprising a lens element arrangement having a first lens element. The method comprises receiving a signal from a first pressure sensor, the first pressure sensor being arranged to measure at least one pressure value adjacent the first lens element, determining a pressure difference over the first lens element based on the signal received from the pressure sensor. The determined pressure difference may indicate a change in the pressure difference over the first lens element. The method further comprises determining one or more adjustments to a position of at least one of the substrate table and projection system based upon the determined pressure difference, and causing one or more actuators to make the one or more adjustments to the at least one of the substrate table and the projection system.

The method may further comprise determining a displacement of the first lens element and/or a further lens element of the lens element arrangement of the projection system, and determining the one or more adjustments based upon the determined displacement.

The method may further comprise determining one or more image error characteristics based upon the determined pressure difference and determining the one or more adjustments based upon the determined image error characteristics.

The method may further comprise determining a pressure difference over a second lens element based on signals received from a second pressure sensor arranged to measure at least one pressure value adjacent to a second lens element of the lens element arrangement of the projection system. The determined pressure difference over the second lens element may indicate a change in the pressure difference over the second lens element. The pressure difference and/or change in pressure difference may result in image errors at the substrate. The method may further comprise causing one or more actuators to make the one or more adjustments to the at least one of the substrate table and the projection system.

The first lens element may be a final lens element of the projection system. The first lens may be attached to a housing of the projection system via a seal, the seal being at least partially permeable to a surrounding environment of the first lens element.

The seal may act as a low-pass filter for pressure waves within the surrounding environment of the first lens. In this case, the first change may be a change in the pressure difference over a lens element adjacent the first lens element.

Various aspects and features of the invention set out above or below may be combined with various other aspects and features of the invention as will be readily apparent to the skilled person.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target region", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target region of the substrate. It should be noted that the pattern imparted to the radiation beam may not exactly correspond to the desired pattern in the target region of the substrate. Generally, the pattern imparted to the radiation beam will correspond to a particular functional layer in a device being created in the target region, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. In particular, it holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

Figure 1A:
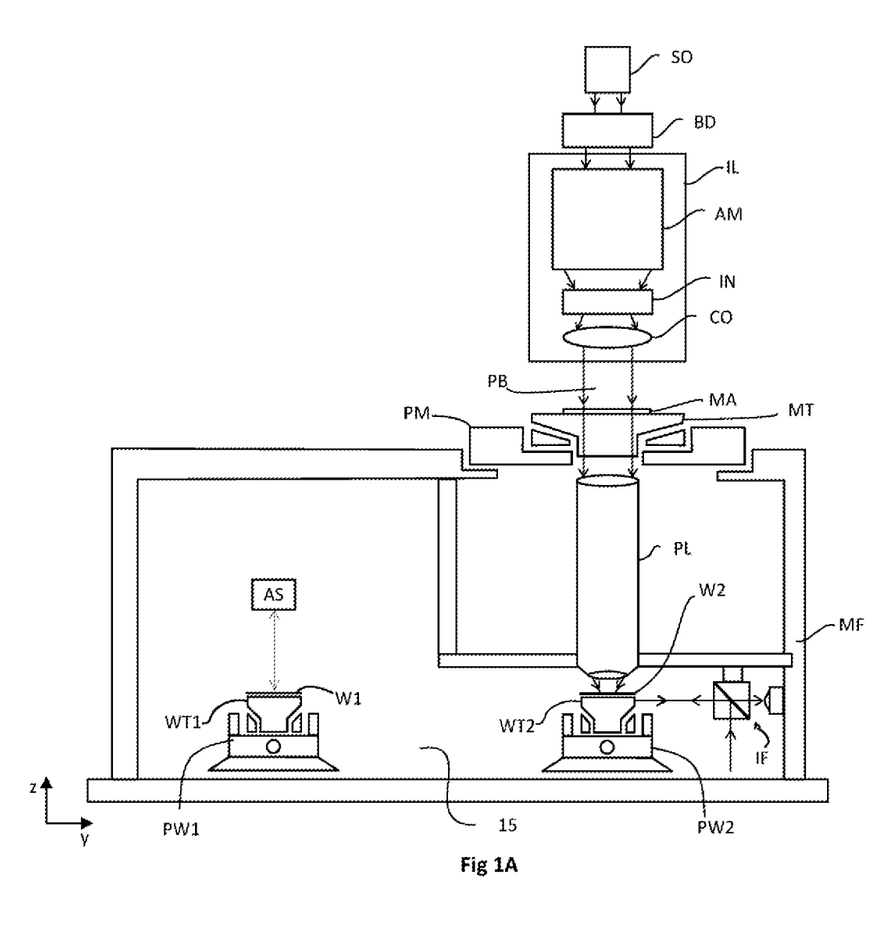
FIG. 1 schematically depicts a lithographic apparatus suitable for use with at least one embodiment of the invention.

FIG. 1A schematically depicts a lithographic apparatus according to a particular embodiment of the invention. The apparatus comprises:

- an illumination system (illuminator) IL for conditioning a beam PB of radiation (e.g. UV radiation or DUV radiation);
- a frame MF;
- a support structure (e.g. a mask table) MT to support a patterning device (e.g. a mask) MA;
- two substrate tables (e.g. a wafer table) WT1, WT2, each for holding a substrate (e.g. a resist coated wafer) W1, W2 respectively; and
- a projection system (e.g. a refractive projection lens) PL configured to image a pattern imparted to the radiation beam PB by patterning device MA onto a target portion C (e.g. comprising one or more dies) of a substrate W held by one of the two substrate tables WT1, WT2.

The frame MF is a vibration isolated frame that is substantially isolated from external influences such as vibrations. For example, the frame MF may be supported by a base frame (not shown) on the ground via acoustically damping mounts (not shown), so as to isolate the frame MF from vibrations of the base frame. These acoustically damping mounts may be actively controlled to isolate vibrations which are introduced by the base frame and/or by the isolated frame MF itself.

In the example dual stage lithographic apparatus depicted in FIG. 1A an alignment system AS and a topography measurement system TMS are provided on the left-hand side and the projection system PL is provided on the right-hand side. The projection system PL, alignment system AS and topography measurement system TMS are connected to the isolated frame MF.

The support structure MT is movably mounted to the frame MF via a first positioning device PM. The first positioning device PM may be used to move the patterning device MA, and to accurately position it, relative to the frame MF (and the projection system PL which is connected to the frame MF).

The substrate tables WT1, WT2 are movably mounted to the frame MF via first and second substrate positioning devices PW1, PW2 respectively. The first and second substrate positioning devices PW1, PW2 may be used to move substrates W1, W2 held by substrate tables WT1, WT2 respectively, and to accurately position the substrates W1, W2, relative to the frame MF (and the projection system PL, alignment system AS and topography measurement system TMS which are connected to the frame MF). The support structure MT and the substrate tables WT1, WT2 may be referred to collectively as object tables. The first and second substrate positioning devices PW1, PW2 may each be considered to be a scanning mechanism operable to move the substrate table WT2 along a scanning path relative to the radiation beam such that the radiation beam scans across a target region C of the substrate W.

The lithographic apparatus shown in FIG. 1A is therefore of a type having two substrate tables WT1, WT2, which may be referred to as a dual stage apparatus. In such "multiple stage" machines the two substrate tables WT1, WT2 are used in parallel, with preparatory steps being carried out on one of the substrates tables while the other substrate table is being used for exposure.

In FIG. 1A, the substrate table WT1 is disposed on the left and the substrate table WT2 is disposed on the right. In this configuration, substrate table WT1 can be used to carry out various preparatory steps in relation to the substrate W1 held thereby using alignment system AS and topography measurement system TMS prior to exposure of that substrate W1. Simultaneously, the substrate table WT2 can be used for exposure of another substrate W2 held by substrate table WT2. Once the substrate W2 held by substrate table WT2 has been exposed and the preparatory steps in relation to the substrate W1 held by substrate table WT1 have been carried out, the two substrate tables WT1, WT2 swap places. Subsequently, the substrate W1 held by substrate table WT1 is exposed to radiation and the substrate W2 held by substrate table WT2 that has previously been exposed to radiation is replaced with a new substrate and various preparatory steps are performed in relation to the new substrate.

Therefore each of the two substrate tables WT1, WT2 can be disposed either on the left or the right of FIG. 1A. Unless stated otherwise, in the following substrate table WT1 will generally refer to the substrate table which is at that time disposed on the left, and substrate table WT2 will generally refer to the substrate table which is at that time disposed on the right.

Figure 1B:
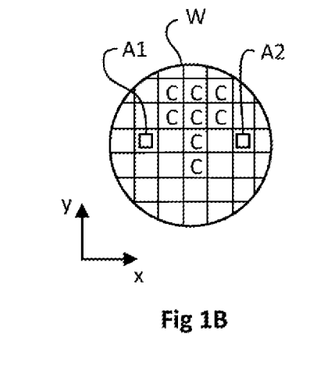
Figure 1C:
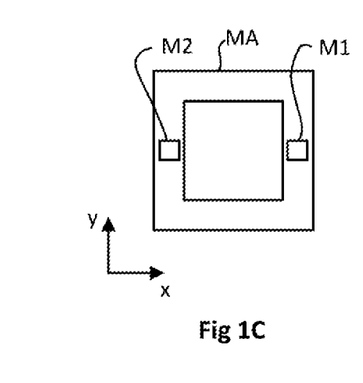

FIG. 1B shows a plan view of a substrate W which may represent either of the two substrates W1, W2 of FIG. 1A. In the following, unless otherwise stated, substrates on the left and right of the lithographic apparatus will be referred to as substrate W. Figure 1C shows a plan view of the patterning device MA, which is provided with patterning device alignment marks (schematically depicted as boxes M1, M2).

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source SO and the lithographic apparatus may be separate entities, for example when the source SO is an excimer laser. In such cases, the source SO is not considered to form part of the lithographic apparatus and the radiation beam is passed from the source SO to the illuminator IL with the aid of a beam delivery system BD comprising for example suitable directing mirrors and/or a beam expander. In other cases the source may be an integral part of the apparatus, for example when the source is a mercury lamp. The illuminator IL may be referred to as a radiation system. Alternatively, the source SO and the illuminator IL, together with the beam delivery system BD if required, may be collectively referred to as a radiation system.

The illuminator IL may alter the intensity distribution of the beam. The illuminator may be arranged to limit the radial extent of the radiation beam such that the intensity distribution is non-zero within an annular region in a pupil plane of the illuminator IL. Additionally or alternatively, the illuminator IL may also be operable to limit the distribution of the beam in the pupil plane such that the intensity distribution is non-zero in a plurality of equally spaced sectors in the pupil plane. The intensity distribution of the radiation beam in a pupil plane of the illuminator IL may be referred to as an illumination mode.

The illuminator IL may comprise adjusting means AM for adjusting the intensity distribution of the beam. Generally, at least the outer and/or inner radial extent (commonly referred to as σ-outer and σ-inner, respectively) of the intensity distribution in a pupil plane of the illuminator can be adjusted. The illuminator IL may also be operable to vary the angular distribution of the beam in a pupil plane of the illuminator. For example, the illuminator IL may be operable to alter the number, and angular extent, of sectors in the pupil plane wherein the intensity distribution is non-zero. By adjusting the intensity distribution of the beam in the pupil plane of the illuminator, different illumination modes may be achieved. For example, by limiting the radial and angular extent of the intensity distribution in the pupil plane of the illuminator IL, the intensity distribution may have a multi-pole distribution such as, for example, a dipole, quadrupole or hexapole distribution, as is known in the art. A desired illumination mode may be obtained by inserting an optic which provides that illumination mode into the illuminator IL.

The illuminator IL may be operable alter the polarization of the beam and may be operable to adjust the polarization using adjusting means AM. The polarization state of the radiation beam across a pupil plane of the illuminator IL may be referred to as a polarization mode. The use of different polarization modes may allow greater contrast to be achieved in the image formed on the substrate W. The radiation beam may be unpolarized.

Alternatively, the illuminator IL may be arranged to linearly polarize the radiation beam. The polarization direction of the radiation beam may vary across a pupil plane of the illuminator IL, i.e. the polarization direction of radiation may be different in different regions in the pupil plane of the illuminator IL. The polarization state of the radiation may be chosen in dependence on the illumination mode.

In addition, the illuminator IL generally comprises various other components, such as an integrator IN and a condenser CO. The illuminator IL provides a conditioned beam of radiation PB, having a desired uniformity and intensity distribution in its cross section.

The radiation beam PB exiting the illuminator IL is incident on the patterning device (e.g. mask) MA, which is held on the support structure MT. Having traversed the patterning device MA, the beam PB passes through the projection system PL, which focuses the beam onto a target portion C of the substrate W. With the aid of the second substrate positioning device PW2 and position sensor IF (e.g. an interferometric device), the substrate table WT2 can be moved accurately relative to the frame MF, e.g. so as to position different target portions C in the path of the beam PB. Similarly, the first positioning device PM and another position sensor (which is not explicitly depicted in FIG. 1A) can be used to accurately position the patterning device MA with respect to the frame MF, e.g. after mechanical retrieval from a mask library, or during a scan. In general, movement of the object tables MT and WT1, WT2 will be realized with the aid of a long-stroke module (coarse positioning) and a short-stroke module (fine positioning), which form part of the positioning devices PM, PW1 and PW2. Patterning device MA and substrate W may be aligned using patterning device alignment marks M1, M2 and substrate alignment marks A1, A2.

The projection system PL may apply a reduction factor to the radiation beam PB, forming an image with features that are smaller than corresponding features on the patterning device MA. For example, a reduction factor of 4 may be applied.

In the scan mode, the first positioning device PM is operable to move the support structure MT relative to the beam of radiation PB that has been conditioned by the illuminator IL along a scanning path. The illuminator IL illuminates an exposure region of the patterning device MA with radiation beam PB and the projection system PL focuses the radiation at an exposure region in a plane of the substrate W.

The area within which the substrate tables WT1, WT2 are disposed is referred to herein as the substrate compartment 15. Movement of the substrate tables WT1, WT2 during exposure and measurement operations can generate pressure waves which propagate within the substrate compartment 15. Such pressure waves may be, for example, of the order of 10 Pa, and may affect various components within the lithographic apparatus. In particular, the pressure waves may result in forces acting on lens elements within the projection system PL. That is, the projection system PL is in communication with the substrate tables WT1, WT2 via a medium through which pressure waves may propagate.

Forces which result from pressure waves within the substrate compartment 15 may act upon the lens elements of the projection system PL resulting in movement, such as tilt and/or vertical (i.e. in the z-direction) displacement of the lens elements from their intended (or 'set-point') positions. Such vertical displacement may result in errors in the image projected onto the substrate W (sometimes referred to as the "aerial image"). It will be appreciated that the particular errors in the image projected onto the substrate that result from displacement of the lens elements within the projection system PL will depend on the optical sensitivity of the lens elements that are subject to displacement. Such an optical sensitivity may be determined through empirical tests performed on the projection system or may be provided by suppliers of the lens elements based on the physical properties of those lens elements.

Figure 2:
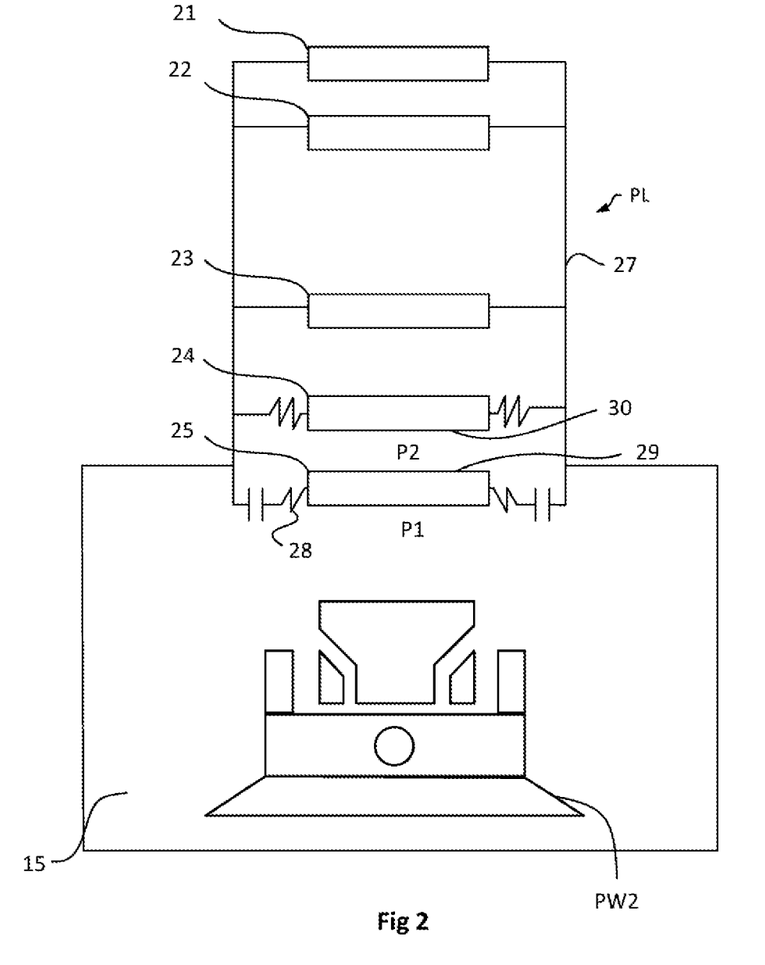
FIG. 2 schematically depicts a projection system and substrate table of the lithographic apparatus of FIG. 1 in more detail.

FIG. 2 schematically depicts an example projection system PL in which there is shown first to fifth lens elements 21-25. It will be appreciated that the depiction of five lens elements is merely exemplary and that the projection system PL may comprise any number of lens elements. In FIG. 2, lens element 25 is the "last" lens element—i.e. the lens element closest to the substrate W2 (not shown in FIG. 2). A face 26 of the lens element 25 directly opposes the substrate W2. A first pressure P1 prevails in a first area adjacent the face 26. The first area may be delimited by the substrate compartment 15, or may be delimited by other components (such as an immersion bath where the lithographic apparatus is an immersion system). The lens element 24 is adjacent to and upstream of lens element 25. A face 29 of the lens element 25 opposes a face 30 of the lens element 24. The faces 29, 30 together with the housing 27 of the projection system PL delimit a second space in which a second pressure P2 prevails.

A difference between the first and second pressures P1, P2 is denoted as DP12 herein. The set-point (i.e. intended, or base level) value of DP12 may be selected and/or determined based upon requirements and/or the configuration of the lithographic apparatus. In an embodiment, the projection system PL is part of an immersion lithographic system in which an immersion bath containing an immersion medium (for example, highly purified water) may be provided between the lens element 25 and the substrate W2 in order to increase the numerical aperture and thereby increase the resolution of the lithography apparatus. In such a system, the lens element 25 may be connected to a housing 27 of the projection system by a permeable (or "leaky") seal 28 to reduce the pressure gradient over the lens element 25. In particular, the lens element 25 may have a higher optical sensitivity and be attached to the housing 27 with a lower stiffness than the lens element 24, for example. In this case, the set-point value of DP12 may be equal to zero.

The seal 28 may, however, allow pressure waves traveling within the first area to cause changes in the pressure difference DP12 over the first lens element 25. The characteristics of the seal 28 will determine how pressure waves in the substrate compartment 15 alter the pressure difference DP12 over the lens element 25. For example, where the seal 28 is sufficiently "open", then P1 and P2 will be substantially the same, and changes in P1 will be reflected in equivalent changes in P2. As such, for sufficiently "open" configurations, pressure waves within the substrate compartment 15 will not generally result in changes in DP12. However, where the seal 28 is sufficiently "closed", the seal 28 may act as a low-pass filter for pressure waves, such that high-frequency pressure waves, generated as a result of movement of the substrate table WT, act on the underside of the lens element 25 and cause changes in the pressure DP12 over the lens element 25.

Figure 3:
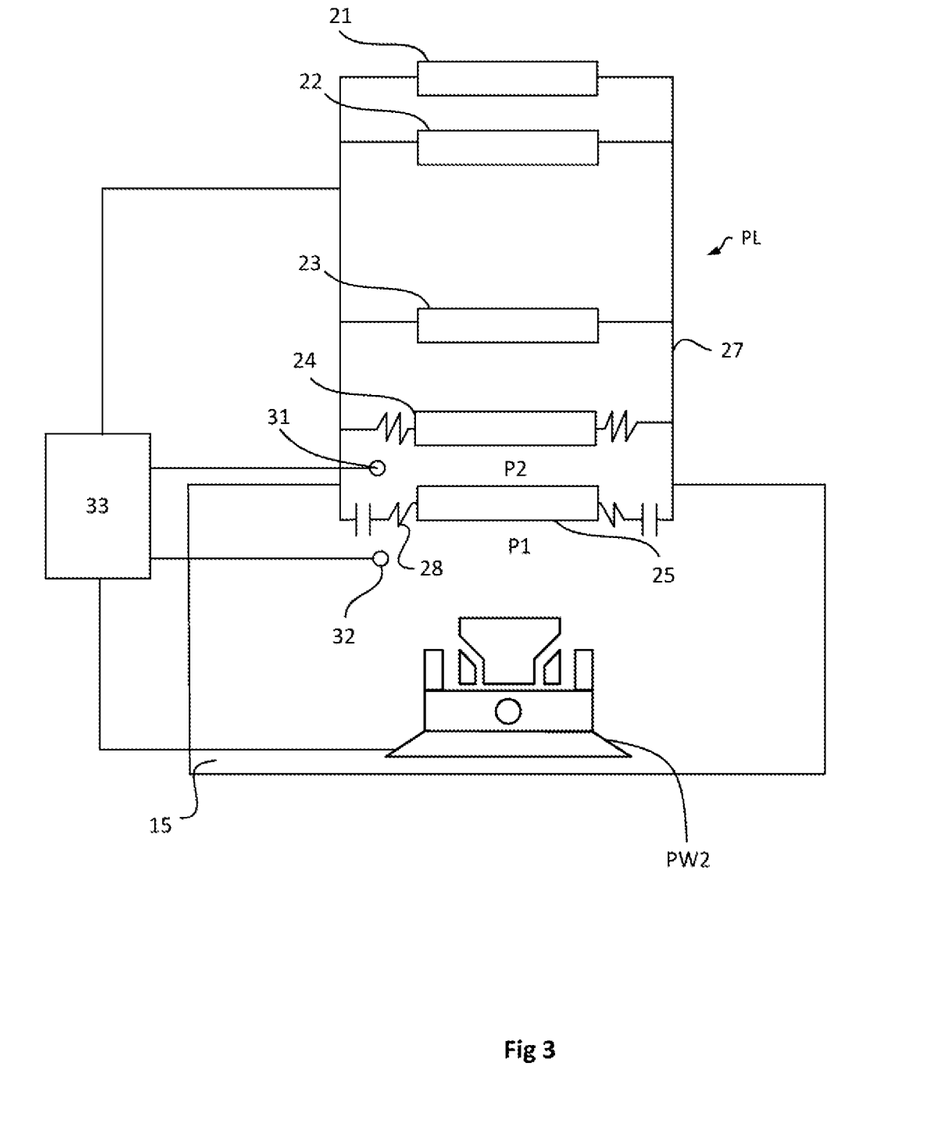
FIG. 3 schematically depicts an error correction system according to an embodiment of the invention.

As described above, changes in DP12 will result in displacements of the lens element 25, and consequently imaging errors at the substrate. Referring to FIG. 3, an embodiment of a projection system PL is depicted in which a pressure sensor 31 is disposed in the first area, and a second pressure sensor 32 is disposed in the second area. The pressure sensors 31, 32 may be any pressure sensors suitable for measuring P1 and P2 respectively, and/or for measuring DP12. The pressure sensors 31, 32 are connected to a controller 33 arranged to receive from the pressure sensors 31, 32 signals indicative of P1 and P2, and/or DP12. Where the controller 33 receives signals indicative of P1 and P2, the controller 33 may be arranged to determine DP12. The controller 33 is arranged to determine, based upon the signals received from the pressure sensors 31, 32, one or more image error characteristics. For example, the controller 33 may be arranged to determine overlay and focus image error characteristics.

Figure 4:
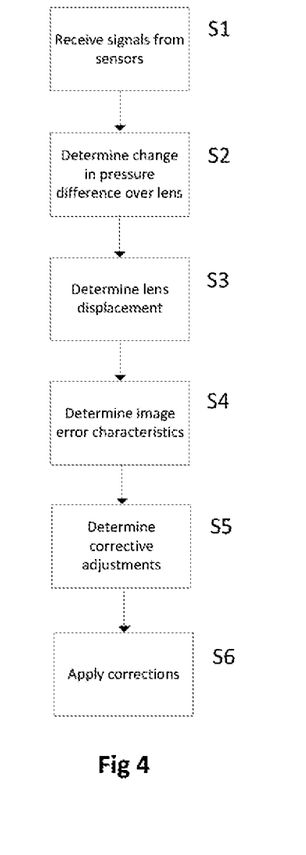
FIG. 4 is a flowchart showing processing that may be carried out by a controller of the error correction system of FIG. 3.

FIG. 4 is a flowchart showing processing that may be carried out by the controller 33. At step S1, the controller 33 receives signals from the sensors 31, 32. As described above, the controller 33, at step S2, uses the signals received from the sensors 31, 32 to determine changes in the pressure difference DP12 over the lens element 25. As described above, the pressure sensors 31, 32 may provide signals indicative of the pressure difference DP12 directly, such that the determination at step S2 may require nothing more than appropriate processing of the received signals. At step S3, the controller determines a displacement of the lens element 25 based upon the determined pressure difference. The determination of a displacement at step S3 may be based upon a stored pressure behaviour model of the lens 25. The pressure behaviour model of the lens may be based upon any appropriate properties such as the stiffness of the seal 28 between the lens element 25 and the housing 27.

From step S3, processing passes to step S4 at which the controller 33 determines one or more image error characteristics based upon the lens deployment determined at step S3. For example, based upon known lens characteristics, the controller may determine that displacement by a certain amount results in particular focus and/or overlay errors. It will be appreciated that image errors caused by particular displacements will depend upon the configuration of the lens elements in the projection system PL. The relationship between displacement of the lens element 25 and any determined image error characteristics may be pre-determined and stored in a memory accessible by the controller 33.

Processing passes to step S5 at which the controller 33 determines one or more adjustments to correct the determined image errors. For example, the controller may determine adjustments to be made to the position of the substrate table WT (e.g. by controlling the substrate positioning device PW2), and/or adjustments to be made to the positions of the lens elements in the projection system PL. Again, it will be appreciated that the adjustments to be made in response to a determined image error will depend upon the configuration of the lithographic apparatus. By way of example, however, where it is determined that a particular displacement results in an unwanted magnification of the image, the controller 33 may determine one or more adjustments to be made to the lens elements in the projection system PL to reduce or eliminate the unwanted magnification. Similarly, if it is determined that a particular displacement results in focus error, the controller 33 may determine that the projection system PL should be refocused and/or the substrate table translated in the z-direction (of FIG. 1A) to reduce or eliminate the focus error.

Having determined the corrective adjustments at step S5, processing passes to step S6 at which the controller 33 causes the determined adjustments to be made. For example, the controller 33 may send signals directly to the relevant actuators via connections 34, 35 as depicted in FIG. 3. Alternatively, the controller 33 may communicate with other controllers or systems to cause the determined adjustments to be made. The processing of FIG. 4 may be performed in real-time to allow for image errors to be corrected in real-time in response to pressure waves caused by operation of the lithographic apparatus during exposure of a substrate. That is, the processing of FIG. 4 may provide a control-loop that executes during exposure and/or measurement operations to provide real-time correction for imaging errors caused by pressure waves generated as a result of operation of the lithographic apparatus.

It is to be understood that the processing of FIG. 4 is merely exemplary and that other processing may be performed. For example, while in the exemplary embodiment of FIG. 4 the controller 33 determines a displacement based upon the determined change in pressure over the lens element 25, in other embodiments, the controller 33 may simply determine image error characteristics directly from the determined change in the pressure difference over the lens element 25. For example, the controller 33 may access data in a memory which provides a correspondence between particular changes in pressure with one or more image error characteristics. Such data may take any form, but may be, for example, provided in the form of a look-up table. Similarly, in some embodiments, the controller 33 may simply determine one or more corrective adjustments directly from the determined change in pressure difference over the lens element 25.

It will be appreciated that the projection system PL comprises actuators to facilitate adjustments to the lens elements within the projection system PL. It will further be appreciated that the substrate positioning device PW2 comprises actuators in order to adjust the position of the substrate table WT2. For example, the substrate table WT2 may by movable with six-degrees of freedom. As such, in the presently described embodiment, no additional actuators need be provided in order to correct for image errors caused by changes in the pressure over the lens element 25. The methods and systems described herein may therefore be implemented conveniently in existing lithographic apparatuses with little modification.

Figure 5:
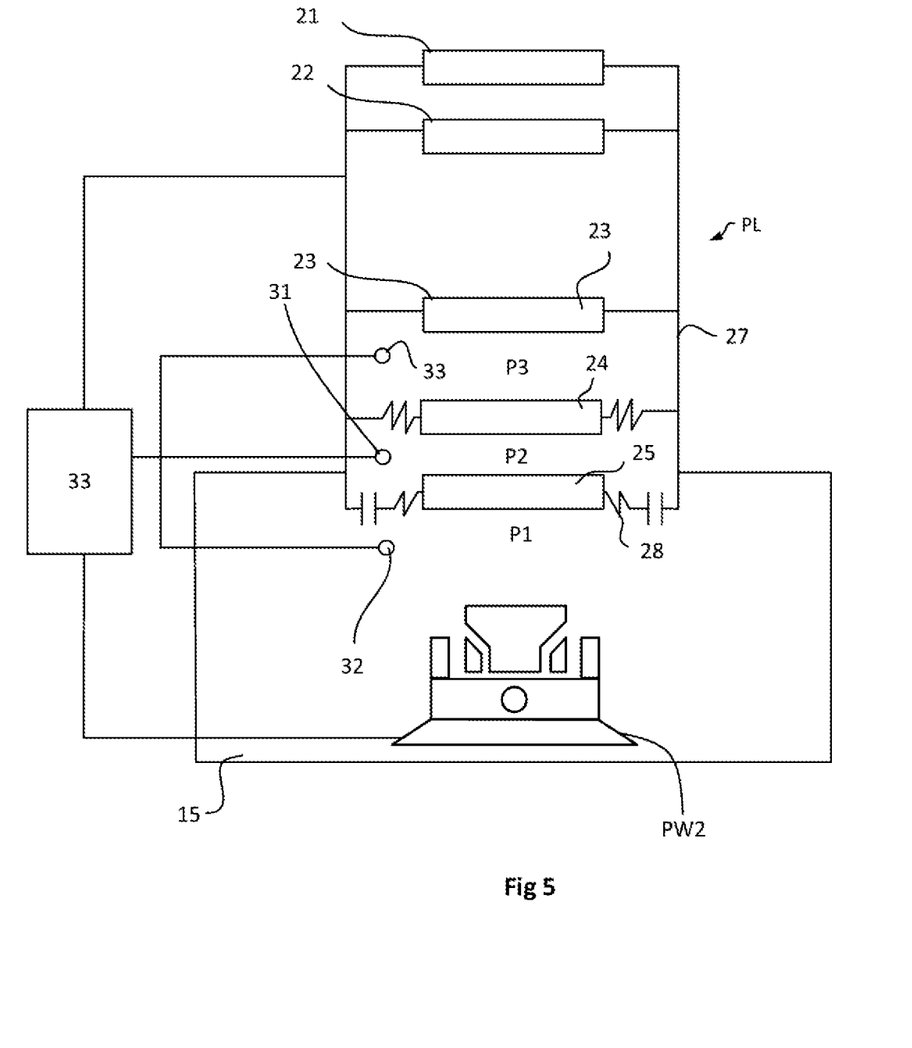
FIG. 5 schematically depicts a further error correction system according to a further embodiment of the invention.

In some embodiments, pressure sensors may be provided in additional or alternative positions within and/or around the projection system PL. One example embodiment is schematically depicted in FIG. 5. Here, an additional pressure sensor 53 is provided in a third space delimited by the lens elements 23 and 24 together with the housing 27. A third pressure P3 prevails within the third space. In the arrangement of FIG. 5, therefore, the controller 33 may be adapted to also determine (for example, at step S2 of FIG. 4) a change in a pressure difference DP23 over the lens element 24 and subsequent displacement of the lens element 24 from its set-point position. In this way, the determination of image error characteristics and corresponding corrective adjustments can also account for displacement of the lens element 24.

It will be appreciated that sensors may be provided at any other positions within the projection system PL. While it is described above that pressure waves are generated as a result of movement of the substrate tables WT1, WT2 during exposures, other operations of the lithographic apparatus may similarly generate high frequency pressure waves leading to undesirable displacement of lens elements within the projection system. For example, movement of the mask table MT may generate pressure waves which act upon lens elements closer to the mask (reticle). For example, referring again to FIGS. 2, 3 and 5, pressure sensors may additionally or alternatively be placed above the lens element 21 (e.g. between the lens element 21 and the mask table MD and/or between the lens element 21 and the lens element 22.

Similarly, while the embodiment of FIG. 3 depicts two pressure sensors 31, 32, it will be readily apparent to the skilled person from the disclosure above that fewer pressure sensors may be used. For example, a single pressure sensor may be provided in the first space defined by the first element 25 and the walls of the substrate compartment 15, or in the second space defined by the first and second elements 24, 25 together with the housing 27. Data from a single pressure sensor may then be used to determine or estimate changes in the pressure difference DP12 over the lens element 25. For example, changes in the pressure difference DP12 may be estimated based upon pre-stored pressure models generated from prior measurements and/or from known characteristics of components within the lithographic apparatus.

While specific embodiments of the invention have been described above, it will be appreciated that the invention may be practiced otherwise than as described. The description is not intended to limit the invention. In particular, while the above description refers to exemplary embodiments in which dual-stage immersion lithography systems are used, it will be readily appreciated that the invention is more widely applicable. Indeed, it will be apparent from the above that the invention is applicable to any lithography apparatus in.

The invention claimed is:

1. A lithographic apparatus, comprising:
a substrate table for holding a substrate;
a projection system for projecting a radiation beam onto a target region of the substrate so as to form an image on the substrate, the projection system comprising a lens element arrangement having a first lens element;
a first pressure sensor arranged to measure at least one pressure value adjacent the first lens element; and
a controller operable to, during operation of the lithographic apparatus:
determine a first change in a pressure difference over the first lens element of the projection system based on a signal received from the first pressure sensor,
determine a displacement of the first lens element of the projection system,
determine at least one adjustment to a position of at least one of the substrate table and projection system based upon the determined first change and the displacement, and
cause at least one actuator to make the at least one adjustment to the at least one of the substrate table and the projection system.

2. The lithographic apparatus of claim 1, wherein the controller is further operable to determine one or more image error characteristics based upon the determined first change in the pressure difference and to determine the at least one adjustment based upon the determined one or more image error characteristics.

3. The lithographic apparatus of claim 1, further comprising a second pressure sensor arranged to measure at least one pressure value adjacent a second lens element of the projection system;
the controller being operable to:
determine a second change in a pressure difference over the second lens element of the projection system based on a signal received from the second pressure sensor, and
cause the at least one actuator to make the at least one adjustment to the at least one of the substrate table and the projection system in response to the determined second change.

4. The lithographic apparatus of claim 1, wherein the substrate table is in communication with at least a part of the projection system via a medium through which pressure waves may propagate.

5. The lithographic apparatus of claim 1, further comprising a second substrate table for holding and moving a second substrate;
wherein the second substrate table is in communication with at least a part of the projection system via a medium through which pressure waves may propagate.

6. The lithographic apparatus of claim 1, wherein the lithographic apparatus is an immersion apparatus comprising an immersion bath holding an immersion medium.

7. The lithographic apparatus of claim 1, wherein the first lens element is a final lens element of the projection system.

8. The lithographic apparatus of claim 1 wherein the lens element arrangement further comprises a second lens element and the apparatus further comprises a second pressure sensor arranged to measure at least one second pressure value adjacent the second lens element, and wherein the controller is operable to, during operation of the lithographic apparatus, determine a first change in a pressure difference over the first lens element and a second change in pressure difference over the second lens element of the projection system based on a signal received from the first pressure sensor and a signal received from the second pressure sensor, and determine at least one adjustment to a position of at least one of the substrate table and projection system based at least in part upon the determined first change and second change.

9. The lithographic apparatus of claim 8, wherein the controller is further operable to determine a displacement of the second lens element of the projection system and to determine the one or more adjustments based at least in part upon the displacement of the second lens element.

10. A method for controlling a lithographic apparatus during operation, the lithographic apparatus comprising a substrate table for holding a substrate and a projection system for projecting a radiation beam onto a target region of the substrate so as to form an image on the substrate, the projection system comprising a lens element arrangement having a first lens element, the method comprising:
- receiving a signal from a first pressure sensor, the first pressure sensor being arranged to measure at least one pressure value adjacent the first lens element;
- determining a pressure difference over the first lens element that will result in image errors at the substrate based on the signal received from the pressure sensor,
- determining a displacement of at least one of the first lens element and a further lens element of the lens element arrangement of the projection system;
- determining at least one adjustment to a position of at least one of the substrate table and projection system based upon the determined pressure difference and displacement, and
- causing at least one actuator to make the at least one adjustment to the at least one of the substrate table and the projection system.

11. The method of claim 10, further comprising determining at least one image error characteristic based upon the determined pressure difference; and
- determining the at least one adjustment based at least in part upon the determined at least one image error characteristic.

12. The method of claim 10, further comprising:
- determining a pressure difference over a second lens element that will result in image errors at the substrate based on signals received from a second pressure sensor arranged to measure at least one pressure value adjacent to a second lens element of the lens element arrangement of the projection system; and
- causing at least one actuator to make the at least one adjustment to the at least one of the substrate table and the projection system.

13. A method for controlling a lithographic apparatus during operation, the lithographic apparatus comprising a substrate table for holding a substrate and a projection system for projecting a radiation beam onto a target region of the substrate so as to form an image on the substrate, the projection system comprising a lens element arrangement having a first lens element, the method comprising:
- receiving a signal from a first pressure sensor, the first pressure sensor being arranged to measure at least one pressure value adjacent the first lens element;
- determining a pressure difference over the first lens element that will result in image errors at the substrate based on the signal received from the pressure sensor,
- determining a displacement of at least one of the first lens element and a further lens element of the lens element arrangement of the projection system;
- determining at least one adjustment to a position of at least one of the substrate table and projection system based upon the determined pressure difference and displacement, and
- causing at least one actuator to make the at least one adjustment to the at least one of the substrate table and the projection system,
- wherein the first lens is attached to a housing of the projection system via a seal, the seal being at least partially permeable to a surrounding environment of the first lens element.

14. The method of claim 13, wherein the seal acts as a low-pass filter for pressure waves within the surrounding environment of the first lens and wherein the first change is a change in the pressure difference over a lens element adjacent the first lens element.

15. A lithographic apparatus, comprising:
- a substrate table for holding a substrate;
- a projection system for projecting a radiation beam onto a target region of the substrate so as to form an image on the substrate, the projection system comprising a lens element arrangement having a first lens element;
- a first pressure sensor arranged to measure at least one pressure value adjacent the first lens element; and
- a controller operable to, during operation of the lithographic apparatus:
  - determine a first change in a pressure difference over the first lens element of the projection system based on a signal received from the first pressure sensor,
  - determine at least one adjustment to a position of at least one of the substrate table and projection system based upon the determined first change, and
  - cause at least one actuator to make the least one adjustment to the at least one of the substrate table and the projection system,
- wherein the first lens is attached to a housing of the projection system via a seal, the seal being at least partially permeable to a surrounding environment of the first lens element.

16. The lithographic apparatus of claim 15, wherein the seal acts as a low-pass filter for pressure waves within the surrounding environment of the first lens and wherein the first change is a change in the pressure difference over a lens element adjacent the first lens element.

* * * * *